United States Patent [19]

Feldman et al.

[11] 4,398,824

[45] Aug. 16, 1983

[54] WAFER TILT COMPENSATION IN ZONE PLATE ALIGNMENT SYSTEM

[75] Inventors: Martin Feldman; Alan D. White, both of Berkeley Heights; Donald L. White, Bernardsville, all of N.J.

[73] Assignee: Bell Telephone Laboratories, Incorporated, Murray Hill, N.J.

[21] Appl. No.: 254,486

[22] Filed: Apr. 15, 1981

[51] Int. Cl.³ .............................................. G01B 11/27
[52] U.S. Cl. ................................ 356/401; 350/162.16
[58] Field of Search ............... 356/399, 400, 401, 371; 250/237 G; 350/162.16

[56] References Cited

U.S. PATENT DOCUMENTS

| 3,990,798 | 11/1976 | White | 356/401 |
| 4,037,969 | 7/1977 | Feldman et al. | 356/401 |
| 4,326,805 | 4/1982 | Feldman et al. | 356/401 |

Primary Examiner—R. A. Rosenberger
Attorney, Agent, or Firm—Lucian C. Canepa; Arthur J. Torsiglieri

[57] ABSTRACT

The present invention is a method and apparatus for aligning a semiconductor wafer to be patterned by a step-and-repeat photolithographic system. The inventive alignment technique, which is able to compensate for local wafer tilt and/or nonuniform photoresist thickness, is applicable to semiconductor wafers which have, on a surface portion, one or more Fresnel zone plate alignment marks.

11 Claims, 2 Drawing Figures

WAFER TILT COMPENSATION IN ZONE PLATE ALIGNMENT SYSTEM

TECHNICAL FIELD

This invention relates to the fabrication of integrated circuits and more particularly to a technique for aligning a semiconductor wafer to be patterned by a photolithographic system.

BACKGROUND OF THE INVENTION

The fabrication of microminiature devices and circuits often requires the precise alignment of a mask with respect to a semiconductor wafer. For very high resolution devices, submicron alignment tolerances are often necessary. Such alignment is of particular importance for the use of photolithographic step-and-repeat projection printers such as the GCA Mann DSW 4800.

For alignment, it is customary to employ alignment marks on the wafer surface.

One type of preferred alignment mark is the Fresnel zone plate. (See Klein, M. V., *Optics*, John Wiley and Sons, Inc., New York, 1970, for a general discussion of Fresnel zones and Fresnel zone plates. See also Feldman, M. et al, U.S. Pat. No. 4,037,969, for a discussion of the use of Fresnel zone plates as alignment marks on a semiconductor wafer.)

Illustratively, a Fresnel zone plate alignment mark located on the surface of a semiconductor wafer comprises alternating concentric annular regions of low and high reflectivity. Alternatively, the zone plate alignment mark comprises alternating concentric annular regions which cause reflected light to undergo destructive and constructive interference. Such patterns may be formed in a variety of ways known to the art such as by direct electron beam exposure or by exposing photoresist to light. Wafers to be aligned for use in a step-and-repeat system usually include two or more alignment marks on a surface portion of the wafer. For chip-by-chip alignment there is an alignment mark on each chip.

The Fresnel zone plate alignment marks have a unique optical property which enables them to act simultaneously as a positive lens with focal lengths of f, f/3, f/5 ... and as a negative lens with focal lengths of $-f, -f/3, -f/5$ ... The exact value of f is determined by the geometry of the plates. (See Feldman, supra.) Thus, incident radiation collimated parallel to the optical axis is focused by a Fresnel zone plate alignment mark into a plurality of focused real images at distances, f, f/3, f/5 ... in front of the wafer surface and a plurality of focused virtual images located at distances $-f, -f/3, -f/5$ ... behind the wafer surface. In this specification, distances in front of the wafer surface are taken as positive and distances behind the wafer surface are taken as negative.

Illustratively, to align the semiconductor wafer in accordance with a typical prior art technique, radiation is directed onto a Fresnel zone plate alignment mark to form a plurality of focused real images located at prescribed distances in front of the wafer surface and a plurality of focused virtual images located at prescribed distances behind the wafer surface. A selected one of the focused images, usually the real image associated with the $+f$ focal length or the virtual image associated with the $-f$ focal length, is projected by an optical system onto a four-quadrant photodetector arrangement which, along with appropriate electronic circuitry, serves as a position sensing means. The position sensing means is adapted to determine when the projected image is substantially coincident with a preselected location which illustratively is at the origin of the four-quadrant arrangement. In response to output from the position sensing means, the wafer is then moved so that the projected image coincides with the preselected location, thus achieving alignment.

The accuracy of the above-mentioned prior art zone plate alignment technique is limited by local wafer tilt. Local wafer tilt generally refers to deviations from planar geometry on the wafer surface instead of bulk rotation of the wafer. Local wafer tilt displaces both the real and virtual images formed by the zone plates, thereby producing systematic error. For example, if the zone plate alignment mark is formed on a portion of the wafer surface having a local tilt, the real image associated with the $+f$ focal length can be displaced so that its projection on a photodetector arrangement coincides with a preselected location, even though a similar alignment mark on a tilt-free planar surface would not produce an image, associated with the $+f$ focal length, whose projection on the photodetector arrangement coincides with the preselected location, thereby introducing a systematic error. Illustratively, a local wafer tilt of about 1 $\mu$m/cm can lead to alignment errors on the order of $0.06\mu$ for $300\mu$ focal length zone plates.

A similar problem arises if photoresist covering the semiconductor wafer is of nonuniform thickness. In this case, the refraction of light in regions of nonuniform photoresist thickness can lead to the displacement of images formed by alignment marks on the wafer surface, thereby resulting in systematic alignment errors.

In view of the above, efforts have been directed to finding a way to compensate for local wafer tilt and/or nonuniform photoresist thickness in the alignment of semiconductor wafers for patterning by step-and-repeat photolithographic systems.

SUMMARY OF THE INVENTION

The present invention is a method and apparatus for aligning a semiconductor wafer in a manner which is essentially independent of local wafer tilt and/or nonuniform resist thickness. The invention relies on the fact that in the presence of local wafer tilt and/or nonuniform resist thickness, the real and virtual images formed by a Fresnel zone plate alignment mark are displaced from the positions they would occupy in the absence of local wafer tilt and nonuniform resist thickness by an amount proportional to their distances from the wafer surface. Real images located a positive distance in front of the wafer surface are displaced in the opposite direction from virtual images located a negative distance behind the wafer surface.

We have found that a convenient alignment technique can be achieved by using two of the images formed by a Fresnel zone plate alignment mark.

To achieve alignment in the presence of local wafer tilt and/or nonuniform resist thickness in accordance with the principles of the present invention, first and second images, formed by a Fresnel zone plate alignment mark, and located first and second prescribed distances from the wafer surface, respectively, are projected onto a position sensing means to form corresponding first and second projected images. Alignment is achieved when the first and second projected images are displaced from positions, preselected for each of the projected images, by amounts substantially proportional to the first and second prescribed distances, respectively. This alignment condition is independent of local wafer tilt and/or nonuniform resist thickness. The preselected position for each of the projected images is chosen so that if the wafer were planar, each of the projected images would coincide with the appropriate preselected position.

Illustratively, one of the first and second focused images formed by the alignment mark can be the real image associated with the $+f$ focal length. This image is located a first prescribed distance in front of the wafer surface. Similarly, the second of the focused images can be the focused virtual image, associated with the $-f$ focal length, which under the appropriate condition can be located a second prescribed distance, substantially equal and opposite to the first prescribed distance, behind the wafer surface. In this case regardless of the amount of local wafer tilt, alignment is achieved when the first and second projected images are located substantially equal distances from positions preselected for each of the projected images. In addition, because the first and second prescribed distances are of opposite sign the first and second projected images should be displaced in opposite senses from the positions preselected for each of the projected images.

More particularly, the present invention is a method and apparatus for aligning a semiconductor wafer of the type that includes, on a surface portion of the wafer, image forming means that when illuminated by incident radiation forms at least a first focused image located a first prescribed distance from the wafer surface and a second focused image located a second prescribed distance from the wafer surface. In a particular embodiment, the inventive apparatus comprises: means for directing incident radiation onto the image forming means to form the first and second focused images; position sensing means; means for projecting the first and second focused images onto the position sensing means to form first and second projected images; and means, responsive to the position sensing means for moving the wafer.

Advantageously, the position sensing means is adapted to determine when the first and second projected images are displaced from positions, preselected for each of the projected images, by amounts substantially proportional to the first and second prescribed distances, respectively. Similarly, the moving means is adapted to move the wafer so that the first and second projected images are displaced from the positions, preselected for each of the projected images, by amounts substantially proportional to the first and second prescribed distances, respectively, thereby achieving alignment in accordance with the principles of the present invention.

The above-described novel alignment condition utilized in the present invention can be compared with the alignment condition utilized in the above-mentioned prior art alignment technique. In the prior art technique, the alignment condition was satisfied when a single projected image coincided with a preselected location. As previously indicated, this alignment technique is susceptible to systematic error because it cannot account for local wafer tilt and/or nonuniform resist thickness. In contrast, the alignment condition of the present invention involves the use of two projected images and is valid independent of the amount of local wafer tilt and/or the amount of nonuniformity in the resist thickness.

BRIEF DESCRIPTION OF THE DRAWINGS

For purposes of clarity, the figures have not been drawn to scale.

DETAILED DESCRIPTION

Figure 1:
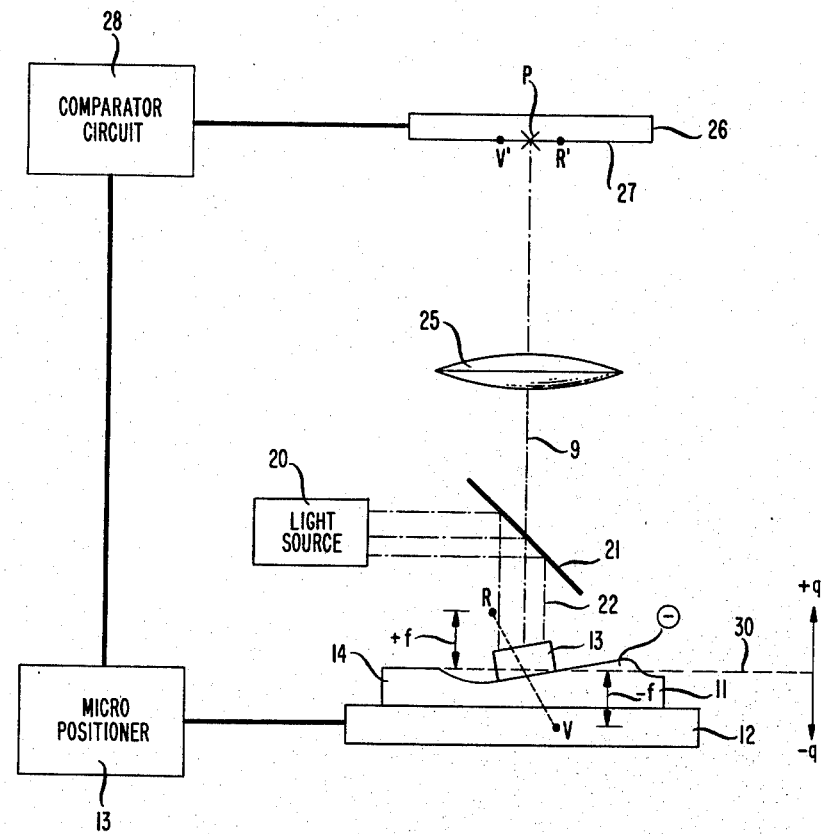
FIG. 1 schematically illustrates an apparatus and method for aligning a semiconductor wafer in accordance with an illustrative embodiment of the present invention.

A conceptual understanding of the principles of the inventive alignment technique can be obtained from the apparatus shown in FIG. 1. Typically, the inventive apparatus is part of a step and repeat photolithographic system.

Turning to FIG. 1, semiconductor wafer 11 is located on movable table 12. Fresnel zone plate alignment mark 13 is located on a portion of wafer surface 14 which has a local tilt $\theta$. Illustratively, $\theta$ is on the order of $10^{-4}$ radians.

Radiation source 20 and mirror 21 serve as a means for directing incident radiation 22 onto the zone plate alignment mark. Illustratively, incident radiation 22 is collimated parallel to optical axis 9.

Radiation 22 is focused by the Fresnel zone plate alignment mark into a plurality of focused real images located at prescribed distances $q=f, f/3, f/5 \ldots$ in front of the wafer surface and a plurality of focused virtual images located at prescribed distances $q=-f, -f/3, -f/5 \ldots$ behind the wafer surface. In FIG. 1, distances in front of the wafer surface are taken as positive and distances behind the wafer surface are taken as negative. Distances in front of the wafer and behind the wafer are measured from plane 30 which represents the average wafer surface. For a typical zone plate alignment mark, $f$ is on the order of $300\mu$.

Two of the focused images formed by the zone plate alignment mark are shown in FIG. 1. The first is the real image, R, associated with the $+f$ focal length and located a first prescribed distance $q=+f$ in front of the wafer surface. The second is the virtual image, V, associated with the $-f$ focal length and located a second prescribed distance $q=-f$ behind the wafer surface, R and V are equally and oppositely displaced from optic axis 9. For purposes of alignment, it is advantageous to use these two images because they are brighter than the higher order real and virtual images which are not shown in FIG. 1.

Bifocal lens 25 is a means for projecting images R and V onto single photodetector means 26 to form first projected image R' and second projected image V'. It should be noted that while R' and V' are shown as points in FIG. 1, they do have finite spatial extent and illustratively are Gaussian spots. A bifocal lens is used to project R and V onto detector means 26 because R and V are not equidistant from surface 27 of detector means 26. The bifocal lens reimages orthogonal polarization components of R and V onto surface 27 to form R' and V', respectively. The use of orthogonal polarization components to form R' and V' is advantageous in that it prevents interference effects near surface 27. (See A. D. White U.S. Pat. No. 3,990,798, issued on Nov. 9, 1976, for a discussion of a bifocal lens element.) It should be noted, however, that under appropriate circumstances means other than a bifocal lens can be used to project R and V onto the detector surface.

Photodetector means 26, along with comparator circuit 28, which is responsive to signals generated by detector means 26, form a position sensing means adapted to determine when first projected image R' and second projected image V' are displaced from positions preselected for each of the projected images by amounts substantially proportional to the first prescribed distance $q=f$ (distance from R to wafer surface) and the second prescribed distance $q=-f$ (distance from V to wafer surface), respectively. In the illustrative example of FIG. 1, the same location P is preselected for each of the two projected images. Thus, alignment is achieved in accordance with the principles of the present invention for the illustrative case shown in FIG. 1 when V' and R' are substantially equally and oppositely displaced from preselected location P. This is because focused images R and V are located equal and opposite prescribed distances from the wafer surface. This alignment condition is valid independent of the amount of local wafer tilt. It should be noted that the preselected location P is chosen so that in the absence of local wafer tilt the two projected images R' and V' would coincide with P.

If the above-mentioned alignment condition is not satisfied, micropositioner 13 and movable table 12 form a moving means, responsive to output from comparator circuit 28, for moving the wafer until the alignment condition is fulfilled.

Advantageously, photodetector means 26 is a four-quadrant photodetector arrangement. Generally, the preselected position P is at the origin of the four-quadrant arrangement. If R' and V' are Gaussian spots, they are substantially equally and oppositely displaced from the preselected position P if the radiation intensities in the first and third quadrants are substantially equal and if the radiation intensities in the second and fourth quadrants are substantially equal. Standard comparator circuit 28 is adapted to determine when this condition is satisfied.

It should be noted that the arrangement of FIG. 1 is merely illustrative of the principles of the present invention and other arrangements may be used to implement those principles. For example, instead of using the real image associated with the $+f$ focal length and the virtual image associated with the $-f$ focal length, other pairs of images formed by the Fresnel zone plate alignment mark can be used to carry out the alignment process.

In addition, instead of projecting the first and second focused images onto a single photodetector means, they can be projected onto first and second separate photodetector means, respectively, to form the first and second projected images. In this case a position on the first photodetector means is preselected for the first projected image and a position on the second photodetector means is preselected for the second projected image.

Figure 2:
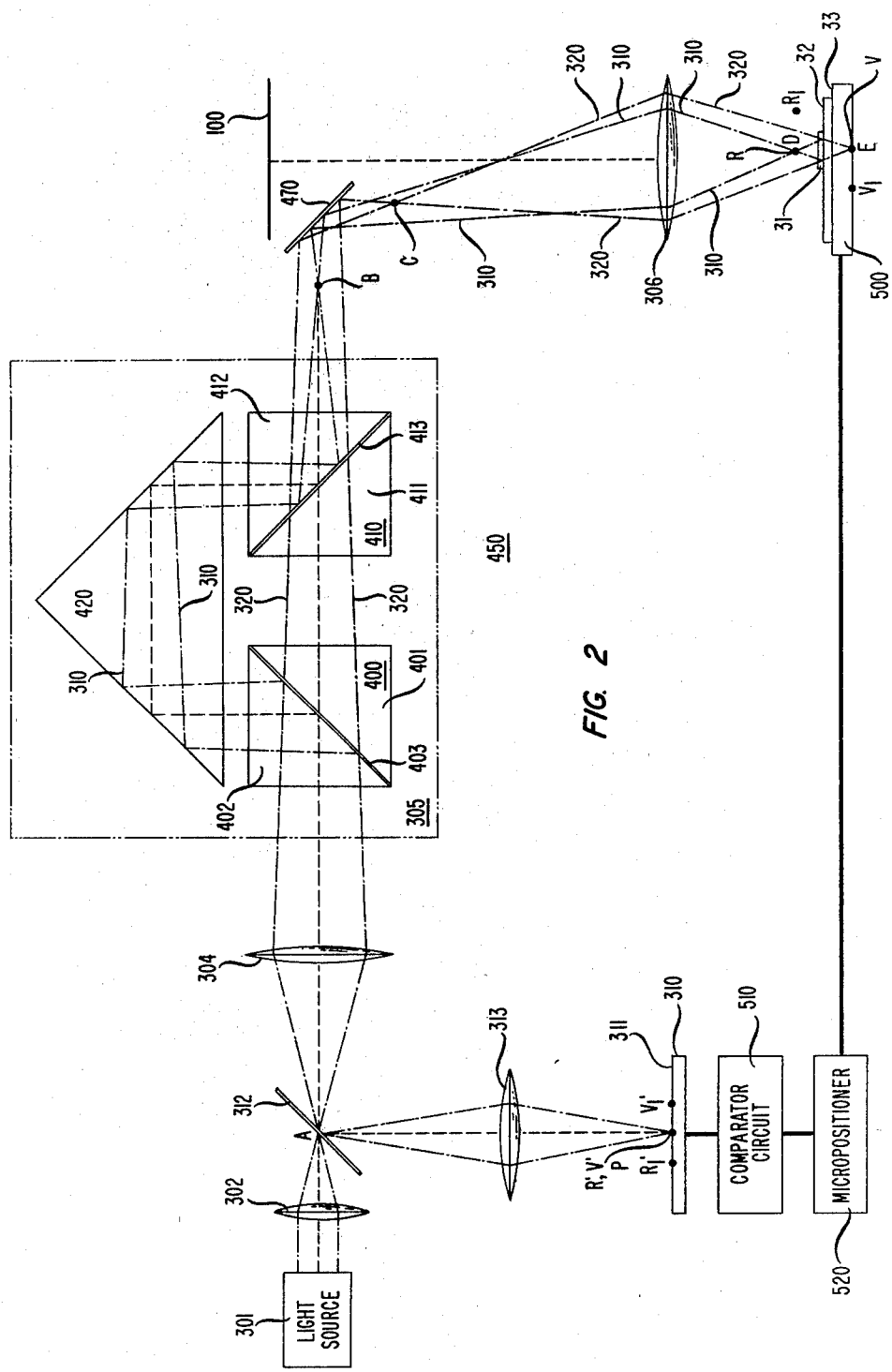
FIG. 2 schematically illustrates an alternative apparatus for aligning a semiconductor wafer, in accordance with an alternative embodiment of the present invention.

An alternative system which can be used to practice the principles of the present invention is shown in FIG. 2. Numerical parameters stated in connection with the embodiment of the invention shown in FIG. 2 are intended to be illustrative only and are not intended to limit the scope of the claimed subject matter.

Turning to FIG. 2, Fresnel zone plate alignment mark 31 is located on surface 32 of semiconductor wafer 33. The wafer is located on movable table 500. Typically, the apparatus of FIG. 2 is part of a step and repeat photolithographic system and the mask whose pattern is to be transferred onto the wafer surface lies in reticle plane 100.

In FIG. 2 radiation is directed at the zone plate alignment mark as follows. Light from monochromatic source 301 is focused by lens 302 at location A. The radiation focused at A is directed by lens 304 into optical means 305. Optical lens 305 is adapted to separate the radiation directed therein into first and second radiation components having first and second orthogonal polarization states, respectively, and to introduce a path length difference in the optical paths traveled by the first and second radiation components, respectively, whereby the first radiation component is focused at location B and the second radiation component is focused at location C. The optical path of the first radiation component (perpendicularly polarized) is shown by lines 310 and the optical path of the second radiation component (parallel polarized) is shown by lines 320.

In the illustrative embodiment of the invention shown in FIG. 2, optical lines 305 comprises polarizing beam splitters 400 and 410 and prism 420. Beam splitter 400 comprises right angle prisms 401 and 402 which meet to form polarizing interface 403. Similarly, beam splitter 410 comprises right angle prisms 411 and 412 which meet to form polarizing interface 413.

Radiation incident on means 305, which is polarized parallel to plane 450 (plane of FIG. 2), is transmitted by interfaces 403 and 413. The parallel polarized radiation (radiation 320) is reflected by mirror 470 and brought to a focus at point C. Radiation incident on means 305, which is polarized perpendicular to plane 450 (radiation 310), is reflected at interface 403, directed through prism 420, and reflected again at interface 413. Illustratively, the perpendicularly polarized radiation is brought to a focus at B.

It should be noted that the difference in optical path lengths traveled by the two orthogonal radiation components can be adjusted by changing the relative positions of beam splitters 400 and 410 and prism 420. Illustratively, locations B and C are chosen so that photolithographic lens 306, which has a magnification M, is able to bring radiation from location B to a real focus at point D a distance $q=2f$ above the wafer surface and bring radiation from location C to a virtual focus at point E a distance $q=-2f$ below the wafer surface. Typically, the difference in optical path lengths traveled by the two orthogonal radiation components is on the order of 12 cm, photolithographic lens 306 has a magnification, M, of about 10, and Fresnel zone plate 11 has a focal length f of about 300µ.

In the absence of wafer tilt and in the absence of a nonuniform resist thickness, the zone plate then forms real and virtual images, R and V, which are almost coincident with D and E, respectively. (This is easily understood by an application of the lens equation to the present geometry in which the objects are respectively a distance $+2f$ and $-2f$ from the alignment mark which has focal lengths of $+f$ and $-f$. Higher order real and virtual images formed by the alignment mark from the incident radiation are not utilized in the illustrative embodiment of the invention shown in FIG. 2.) Actually, because a knife edge is used to separate the incident and reflected radiation in the illustrative embodiment of the invention shown in FIG. 2, locations D and E are both displaced slightly above (below) the plane of FIG. 2 and R and V are both displaced slightly below (above) the plane of FIG. 2. After passing through lens 306 and optical means 305, knife edge 312 and lens 313 are used to project the radiation from R and V onto surface 311 of detector 310 to form a pair of projected images R' and V'. In the case of no local wafer tilt and nonuniform resist thickness, R' and V' coincide. The reason for this is that R and V are coaxial and have no lateral displacement in the absence of local wafer tilt and nonuniform resist thickness. Alignment is achieved when R' and V' coincide with position P which is preselected for each of the projected images.

In the presence of local wafer tilt and/or nonuniform photoresist thickness, the real and virtual images, $R_1$ and $V_1$, formed by alignment mark 31 of FIG. 2 are equally and oppositely displaced from the positions occupied by R and V in the absence of local wafer tilt and nonuniform resist thickness. In this case, projections of $R_1$ and $V_1$ on surface 311 are located at $R_1'$ and $V_1'$, respectively. Alignment is achieved when $R_1'$ and $V_1'$ are equally and oppositely displaced from preselected position P. If the alignment condition is not satisfied, signals from comparator circuit 510 cause micropositioner 520 to move table 500, on which the semiconductor wafer lies, until the wafer is positioned so that the alignment condition is satisfied.

It should be noted that in the embodiment of the invention shown in FIG. 2, $R_1'$ and $V_1'$ are formed from radiation having orthogonal polarization states to prevent interference effects near the detector surface. Alternatively, interference effects may also be prevented by using radiation of two different frequencies to form real image $R_1$ and virtual image $V_1$.

Finally, it is to be understood that the above-described arrangements and procedures are merely illustrative of the many possible specific embodiments which can be devised to practice the principles of the present invention. Numerous and varied other arrangements can be devised in accordance with these principles by those skilled in the art without departing from the spirit and scope of the following claims.

What is claimed is:

1. An apparatus for aligning a semiconductor wafer of the type that includes, on a surface portion of the wafer, image forming means that when illuminated by incident radiation forms at least a first focused image located a first prescribed distance from said surface and a second focused image located a second prescribed distance from said surface;

said apparatus comprising:
means for directing incident radiation onto said image forming means to form said first and second focused images;
position sensing means;
means for projecting said first and second focused images onto said position sensing means to form first and second projected images;
means, responsive to said position sensing means, for moving said wafer,
said position sensing means being adapted to determine when said first and second projected images are displaced from positions, preselected for each of said projected images, by amounts proportional to said first and second prescribed distances respectively;
said moving means being adapted to move said wafer so that said first and second projected images are displaced from said positions, preselected for each of said projected images, by amounts proportional to said first and second prescribed distances, respectively;
wherein said first and second focused images are real and virtual images respectively;
said real image being located a first prescribed distance in front of said wafer surface and said virtual image being located a second prescribed distance behind said wafer surface;
wherein said position sensing means comprises:
at least one photodetector means adapted to generate electronic signals in response to said projected images; and
comparator circuit means, operative in response to said signals, for electronically determining when said first and second projected images are displaced from said positions, preselected for each of said projected images, by amounts proportional to said first and second prescribed distances respectively; and
wherein said position sensing means comprises a single photodetector means onto which said real and virtual images are projected to form said first and second projected images;
the same position on said single detector means being preselected for each of said projected images.

2. Apparatus for aligning a semiconductor wafer of the type that includes on a surface portion thereof image forming means that when illuminated by incident radiation forms real and virtual focused images respectively spaced apart from said wafer surface in opposite directions, said apparatus comprising
means for directing incident radiation at said image forming means to form said focused images,
photodetector means responsive to projected focused images for providing electrical output signals determinative of whether or not said projected images form a preselected pattern on said detector means,
means for projecting said real and virtual focused images onto said photodetector means to form projected focused images thereon,
and means responsive to electrical signals provided by said photodetector means indicative of said real and virtual projected images not forming said preselected pattern for moving said wafer to a position at which said projected images form said preselected pattern on said photodetector means.

3. Apparatus as in claim 2 wherein said directing means comprises a monochromatic source.

4. Apparatus as in claim 3 wherein said real and virtual focused images constitute first-order real and virtual focused images spaced apart from said wafer surface in respectively opposite and equal directions.

5. Apparatus as in claim 4 wherein said projecting means comprises a bifocal lens element.

6. Apparatus as in claim 5 wherein said moving means comprises
a movable table for supporting said wafer,
and a micropositioner coupled to said table and responsive to the output of said photodetector means for selectively moving said table to locate said wafer in a position wherein said real and virtual projected images form said preselected pattern.

7. In an integrated circuit fabrication sequence in which a semiconductor wafer is to be patterned, the wafer being of the type that includes on a surface thereof image forming means that when illuminated by incident radiation forms real and virtual focused images respectively spaced apart from the wafer surface in opposite directions, a method for aligning said wafer comprising the steps of directing incident radiation at said image forming means to form said focused images, projecting said real and virtual images onto a photodetector to form projected focused images thereon, detecting whether or not said projected focused images form a preselected pattern on said photodetector, and, in the event said projected focused images do not form the preselected pattern, moving the wafer to a position at which said projected images do form said preselected pattern on said photodetector.

8. A method as in claim 7 wherein said image forming means comprises a Fresnel zone place alignment mark.

9. A method as in claim 8 wherein said real and virtual focused images constitute first-order real and virtual focused images spaced apart from said wafer surface in respectively opposite and equal directions.

10. A method as in claim 9 wherein a monochromatic source is utilized to direct incident radiation at said image forming means.

11. A method as in claim 10 wherein a bifocal lens element is utilized to project said real and virtual images onto said photodetector to form focused images thereon.

* * * * *

UNITED STATES PATENT AND TRADEMARK OFFICE
CERTIFICATE OF CORRECTION

PATENT NO. : 4,398,824

DATED : August 16, 1983

INVENTOR(S) : Martin Feldman, Alan D. White and Donald L. White

It is certified that error appears in the above-identified patent and that said Letters Patent is hereby corrected as shown below:

Column 6, line 8, "lens" should read --means--; line 21, "lines" should read --means--; line 50, "11" should read --31--; line 58, "-2 f" should read -- -2f --.

Signed and Sealed this

Twenty-fourth Day of January 1984

[SEAL]

Attest:

GERALD J. MOSSINGHOFF

Attesting Officer

Commissioner of Patents and Trademarks